United States Patent [19]
Benshoff

[11] Patent Number: 5,861,796
[45] Date of Patent: Jan. 19, 1999

[54] MULTIPLE POSITION HALL EFFECT SWITCH WITH LEVER ACTUATOR BIASING MECHANISM

[75] Inventor: Richard G. Benshoff, Sarasota, Fla.

[73] Assignee: Easton Corporation, Cleveland, Ohio

[21] Appl. No.: 843,536

[22] Filed: Apr. 18, 1997

[51] Int. Cl.[6] .............................. H01L 43/04; H01H 9/00; H01H 21/00
[52] U.S. Cl. ........................................ 338/32 H; 200/557
[58] Field of Search ......................... 338/32 H; 335/205; 200/6 R, 6 A, 16 A, 16 C, 16 D, 17 R, 18, 553, 557, 291; 74/471 R, 471 XY

[56] References Cited

U.S. PATENT DOCUMENTS

| | | | |
|---|---|---|---|
| 2,589,025 | 3/1952 | Phelps et al. ............... | 200/16 A |
| 2,984,720 | 5/1961 | Fisher ........................ | 335/161 |
| 3,355,960 | 12/1967 | Bureck et al. ............... | 74/471 R |
| 3,571,545 | 3/1971 | Haderer ..................... | 200/291 |
| 3,708,636 | 1/1973 | Sobchak .................... | 200/6 A |
| 3,814,871 | 6/1974 | Osika ........................ | 200/6 A |
| 3,818,154 | 6/1974 | Presentey ................... | 200/6 A |
| 3,852,552 | 12/1974 | Kimijima et al. ............ | 200/557 |
| 4,216,458 | 8/1980 | Edwards ..................... | 338/32 H |
| 4,336,518 | 6/1982 | Holce et al. ................ | 335/205 |
| 4,359,719 | 11/1982 | Schwarzer ................... | 338/32 H |
| 4,728,928 | 3/1988 | Shipley ...................... | 338/32 H |

Primary Examiner—J.R. Scott
Attorney, Agent, or Firm—Tarolli, Sundheim, Covell, Tummino & Szabo

[57] ABSTRACT

A support structure is connected with a base and supports a carrier for movement along a linear path relative to the base. The base includes inner and outer panels. A pair of Hall effect devices are mounted on the inner panel. A magnet is mounted on the carrier. An actuator member is mounted on the outer panel and extends through the inner and outer panels into engagement with the carrier. The actuator member is movable relative to the inner and outer panels to move the carrier and magnet relative to the Hall effect devices. The support structure includes a generally U-shaped support member having a pair of legs which are connected with the inner panel. The carrier is disposed between the legs of the U-shaped support member. The carrier is supported for movement relative to the Hall effect devices by tracks which are disposed on the legs of the U-shaped support member and extend parallel to the inner panel.

49 Claims, 4 Drawing Sheets

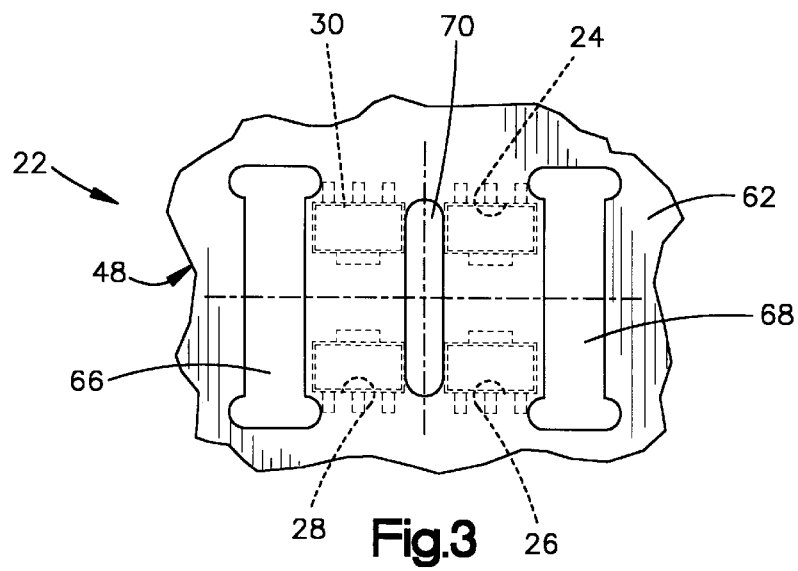
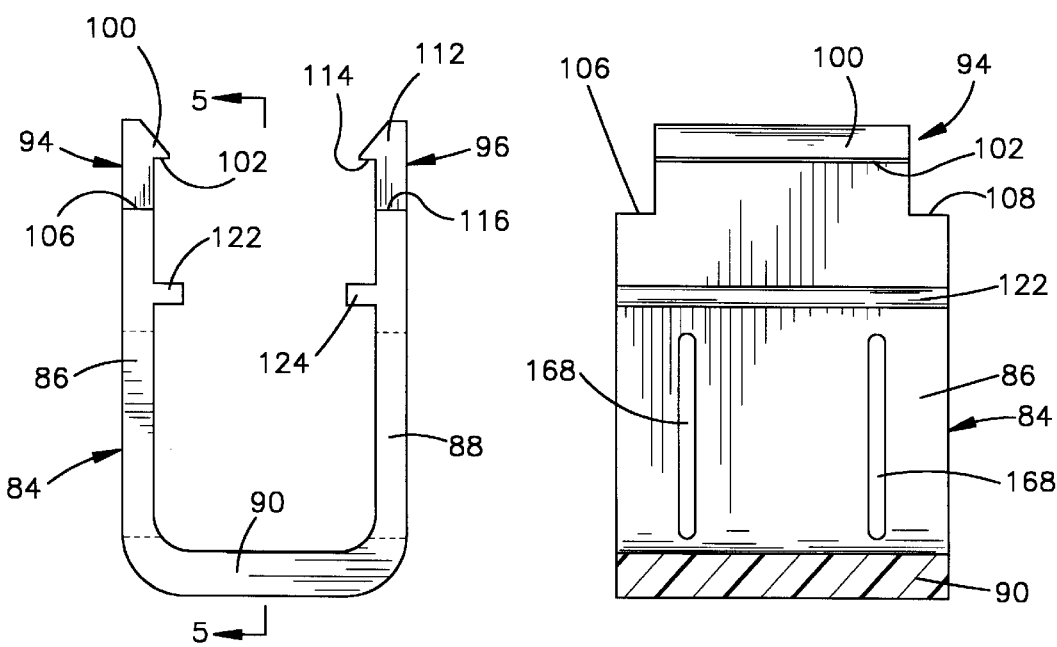

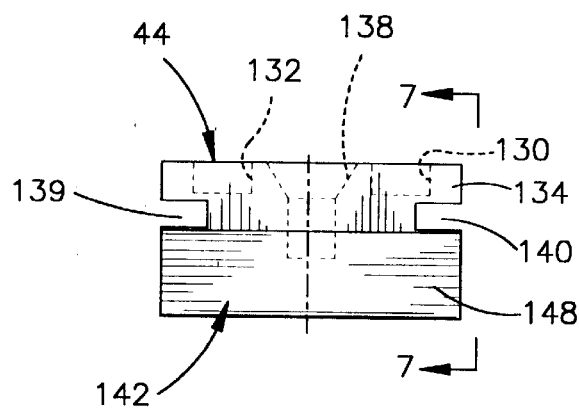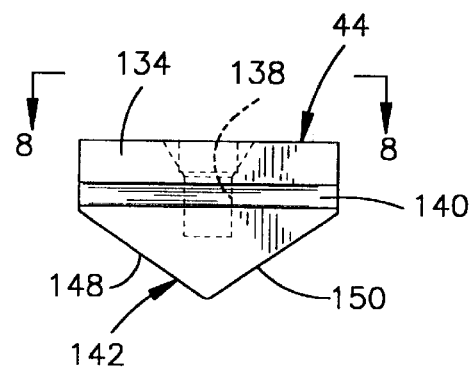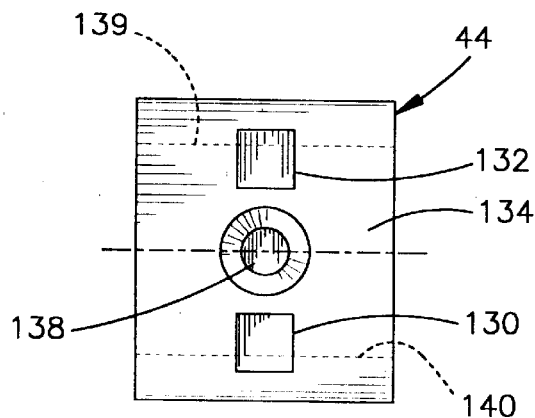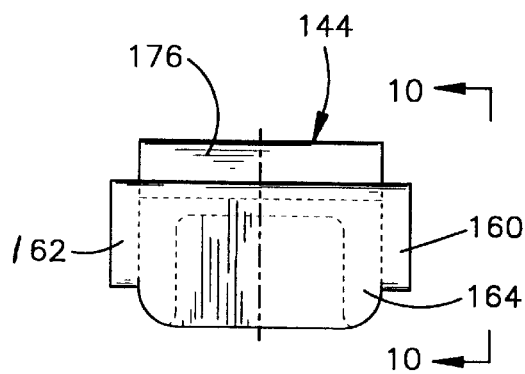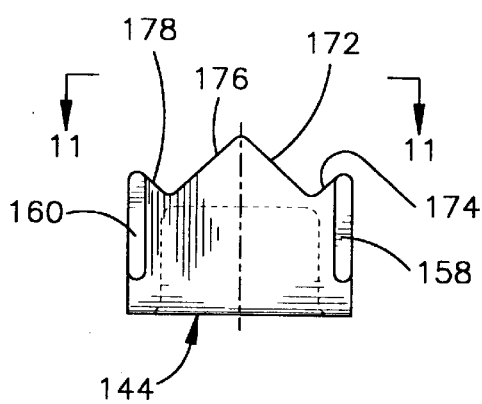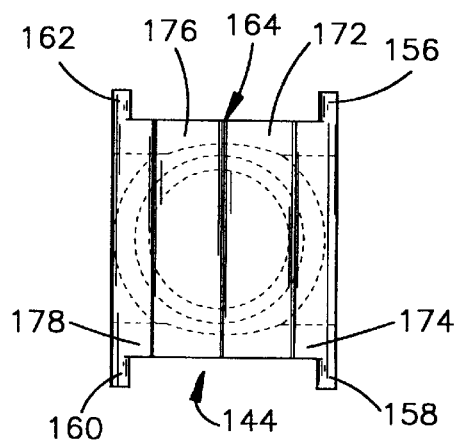

5,861,796

1

MULTIPLE POSITION HALL EFFECT SWITCH WITH LEVER ACTUATOR BIASING MECHANISM

BACKGROUND OF THE INVENTION

The present invention relates to a switch assembly and more specifically to a switch assembly of the non-contact type.

A known switch assembly of the non-contact type includes a pair of Hall effect sensors which are mounted on a circuit board. An actuator member of the toggle type, is pivotally mounted on a front plate disposed in front of the circuit board. The actuator member extends through both the front plate and the circuit board and has a pair of magnets mounted on an end of the actuator member disposed behind the circuit board. A spring loaded detent mounted on the actuator member engages a cam connected with the circuit board. The actuator member is pivotal relative to the cam to move the magnets relative to the Hall effect devices.

Since the actuator member is pivotally mounted on the front plate, the magnets on the inner end of the actuator member, in the known switch, move along an arcuate path relative to the Hall effect devices. This results in imprecise activation of the Hall effect devices during movement of the magnets. Since the actuator member is supported by the front plate and the magnets are mounted on the actuator member, the front plate must be accurately positioned relative to the rear plate and the Hall effect devices.

SUMMARY OF THE INVENTION

The present invention relates to a new and improved switch assembly which is operable between a plurality of conditions. The switch assembly includes a base and a carrier which is movable relative to the base. An actuator member extends through the base and engages the carrier. One or more sensor components mounted on the base are actuated by one or more sensor components mounted on the carrier during movement of the carrier relative to the base.

The sensor components which are mounted on the base may be Hall effect devices. If the sensor components mounted on the base are Hall effect devices, the sensor component mounted on the carrier may be a magnet.

A support structure supports the carrier for movement along a linear path. The linear path extends parallel to an inner major side surface of the base on which the Hall effect devices are mounted. Since the magnet moves along a linear path, there is precise activation of the Hall effect devices by the magnet during movement of the carrier.

The base includes a front panel and a rear panel or circuit board on which the Hall effect devices are mounted. An actuator member which moves the carrier is pivotally mounted on the front panel and extends through an opening in the front panel and the circuit board on which the Hall effect devices are mounted. The support structure for the carrier is mounted on the circuit board on which the Hall effect devices are mounted. By mounting the support structure for the carrier on the circuit board on which the Hall effect devices are mounted, accurate positioning of the carrier and magnet relative to the Hall effect devices is facilitated. An index member may be provided to yieldably hold the carrier in a desired position relative to the Hall effect devices.

BRIEF DESCRIPTION OF THE DRAWINGS

The foregoing and other features of the present invention will become more apparent upon a consideration of the following description taken in connection with the accompanying drawings, wherein:

FIG. 3 is a fragmentary plan view, taken on a reduced scale along the line 3—3 of FIG. 2, illustrating a portion of a circuit board in the switch assembly;

FIG. 4 is an elevational view, on a reduced scale, of a U-shaped carrier support member connected with the circuit board of FIG. 3 in the switch assembly of FIG. 2;

FIG. 5 is a sectional view, taken generally along the line 5—5 of FIG. 4, further illustrating the construction of the carrier support member;

FIG. 6 is an elevational view of a carrier supported by the carrier support member of FIG. 4 in the switch assembly of FIG. 2;

FIG. 7 is an elevational view, taken generally along the line 7—7 of FIG. 6, further illustrating the construction of the carrier;

FIG. 8 is a plan view, taken generally along the line 8—8 of FIG. 7 further illustrating the construction of the carrier;

FIG. 9 is an elevational view of an index member which engages the carrier of FIG. 6 in the switch assembly of FIG. 2;

FIG. 10 is a side elevational view, taken generally along the line 10—10 of FIG. 9, further illustrating the construction of the index member; and FIG. 11 is a plan view, taken generally along the line 11—11 of FIG. 10, further illustrating the construction of the index member.

DESCRIPTION OF ONE SPECIFIC PREFERRED EMBODIMENT OF THE INVENTION

Figure 1:
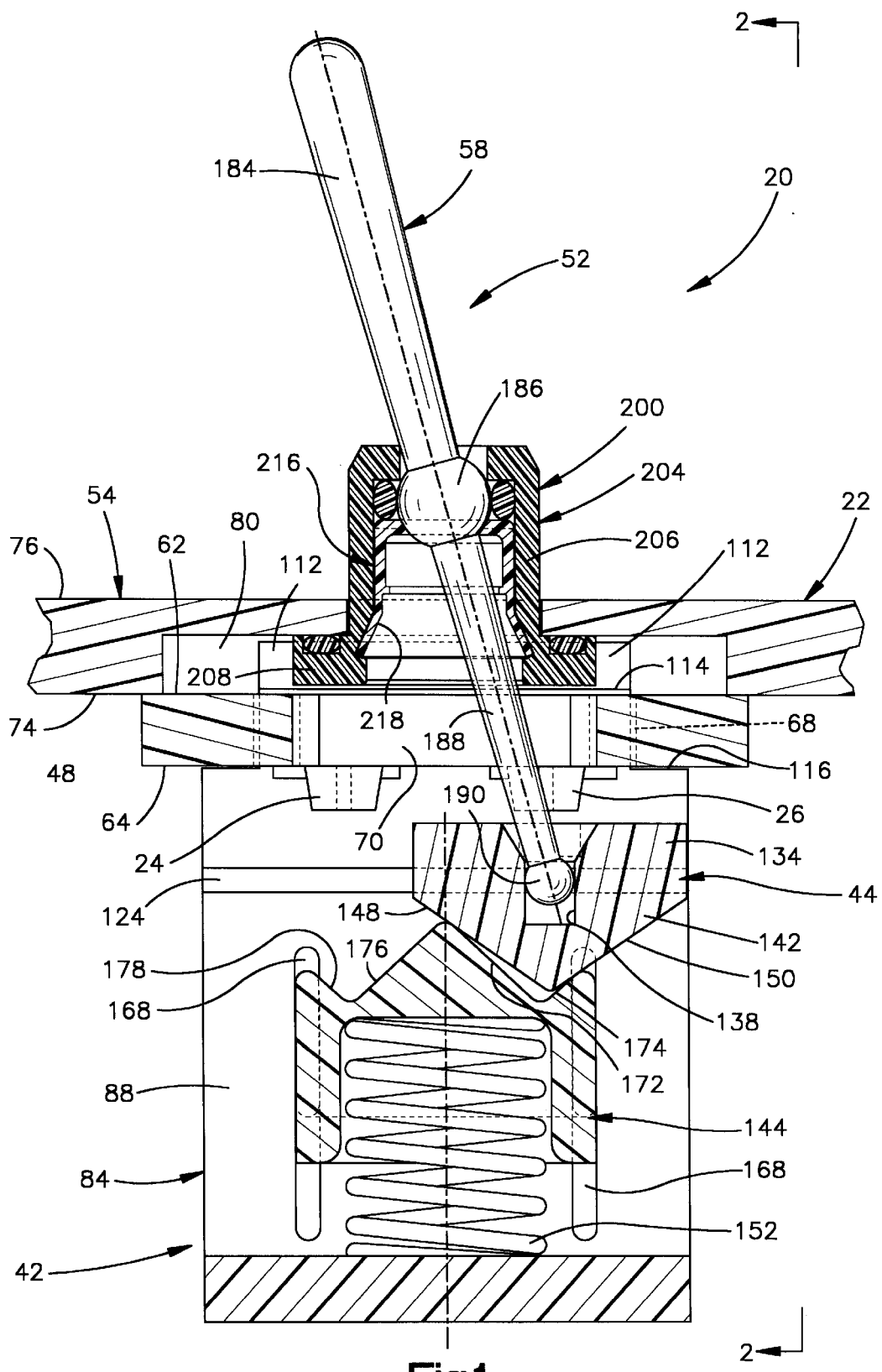
FIG. 1 is an enlarged sectional view of a switch assembly constructed in accordance with the present invention.
Figure 2:
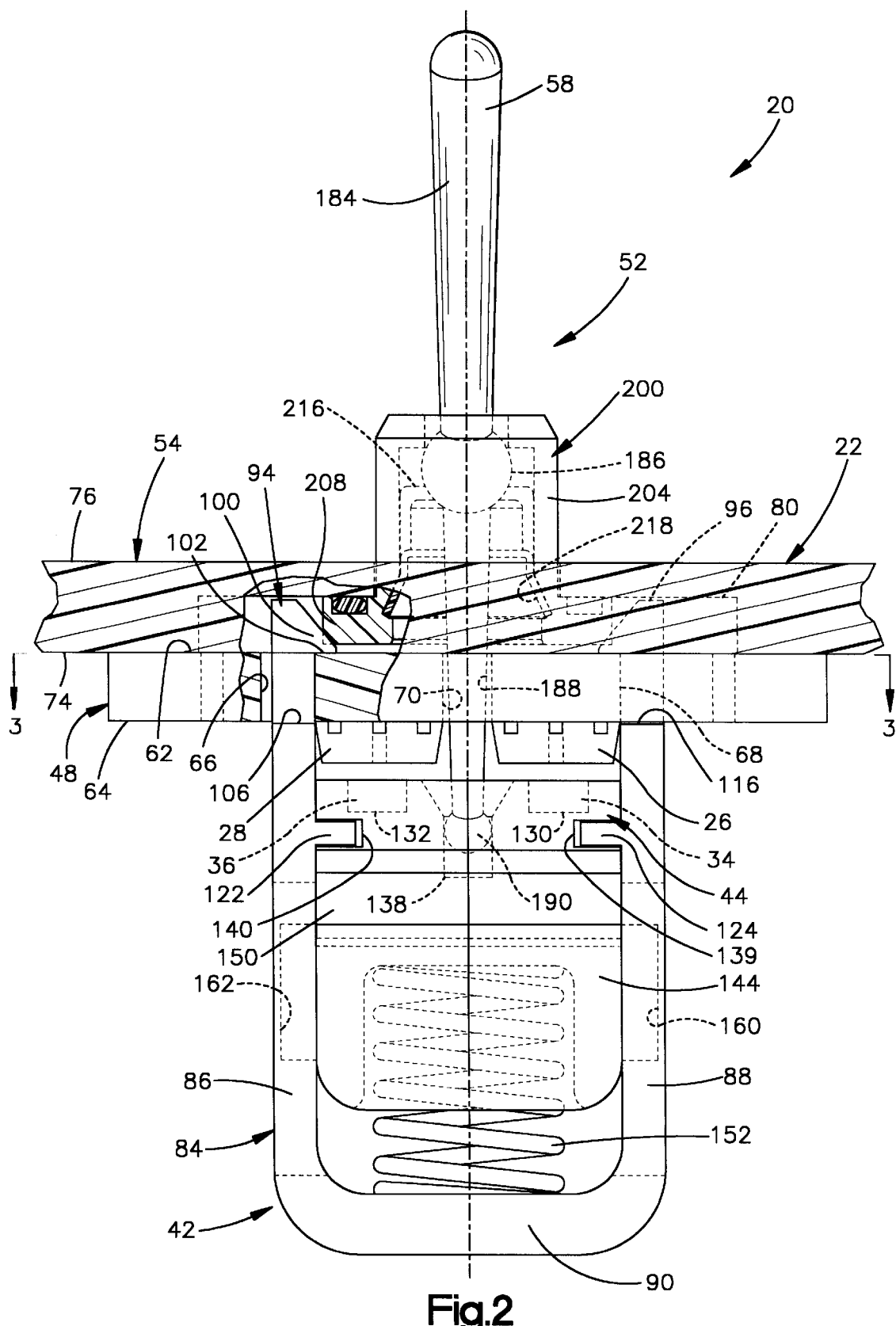
FIG. 2 is a partially broken away elevational view, taken generally along the line 2—2 of FIG. 1, further illustrating the construction of the switch assembly.

A switch assembly 20 constructed in accordance with the present invention is illustrated in FIGS. 1 and 2. The switch assembly 20 is of the non-contact type and includes a base 22 on which a plurality of sensor components are mounted. In the illustrated embodiment of the invention the sensor components are four Hall effect devices 24, 26, 28 and 30 (FIGS. 1, 2 and 3). The Hall effect devices 24–30 are mounted in a rectangular array (FIG. 3) on the base 22.

In accordance with a feature of the invention, magnets 34 and 36 (FIG. 2) for effecting activation of the Hall effect devices 24–30 are movable along a linear path relative to the Hall effect devices. The linear path along which the magnets 34 and 36 are movable extends perpendicular to central axes of the Hall effect devices. Therefore, upon movement of the magnets 34 and 36 into and out of alignment with the Hall effect devices 24–30, there is a precise activation or deactivation of the Hall effect devices.

When the magnets 34 and 36 are moved along the linear path to the position shown in FIGS. 1 and 2 into alignment with the Hall effect devices 26 and 28, there is precise activation of the Hall effect devices 26 and 28. This results in a sharp change in output signals from the Hall effect devices 26 and 28 (FIG. 2). Upon movement of the magnets 34 and 36 out of alignment with the Hall effect devices 26 and 28 and along the linear path toward the Hall effect devices 24 and 30 (FIG. 3) there is a precise deactivation of the Hall effect devices 26 and 28. Subsequently, there is a precise activation of the Hall effect devices 24 and 30.

In the illustrated embodiment of the invention, there are four Hall effect devices 24–30 (FIG. 3) mounted on the base 22 and two magnets 34 and 36 for effecting activation of the Hall effect devices. A greater of lesser number of Hall effect devices and/or magnets could be utilized in the switch assembly 20 if desired. Although it is preferred to use the Hall effect devices 24–30 and magnets 34 and 36 as the sensor components of the switch assembly 20, other known types of sensor components could be utilized if desired. For example, light sources and photocells could be utilized as the sensor components of the switch assembly 20.

In accordance with another feature of the invention, a support structure 42 (FIGS. 1 and 2) accurately positions a magnet carrier 44 relative to the Hall effect devices 24–30 (FIG. 3). The support structure 42 (FIGS. 1 and 2) is mounted directly on a circuit board or rear panel 48 of the base 22. The Hall effect devices 24–30 (FIG. 3) are also mounted on the circuit board 48. By mounting the support structure 42 directly on the circuit board 48, a build up of tolerances in positioning of the magnet carrier 44 relative to the circuit board 48 is avoided.

In accordance with another feature of the present invention, an actuator assembly 52 is mounted on a front panel 54 (FIGS. 1 and 2) of the base 22. This enables the actuator assembly 52 to be accurately positioned relative to the front panel 54 without a build up of tolerances. The actuator assembly 52 (FIG. 1) includes an actuator member 58 which extends through the front panel 54 and circuit board or rear panel 48 into engagement with the magnet carrier 44. The interconnection between the actuator member 58 and magnet carrier 44 is a ball and socket type pivot connection which can accommodate a slight misalignment of the actuator assembly 52 and magnet carrier.

Base

The base 22 (FIGS. 1 and 2) of the switch assembly 20 includes the circuit board or rear panel 48 and the front panel 54. The circuit board 48 has flat parallel front and rear major side surfaces 62 and 64 (FIG. 1). The Hall effect devices 24–30 are mounted on the rear major side surface 64 of the circuit board 48.

The circuit board 48 has a pair of parallel longitudinally extending slots or openings 66 and 68 (FIG. 3). The support structure 42 (FIG. 2) extends through the slots 66 and 68. In addition, the circuit board 48 has a slot 70 (FIG. 3) which is disposed midway between the slots 66 and 68. The actuator member 58 (FIG. 1) extends through the slot 70.

The Hall effect devices 24–30 are mounted on the circuit board 48 between the slots 66 and 68 through which the support structure 42 extends (FIGS. 2 and 3). Specifically, the Hall effect devices 24 and 26 are mounted between the slot 68 through which the support structure 42 extends and the slot 70 through which the actuator member 58 extends (FIGS. 1 and 3). Similarly, the Hall effect devices 28 and 30 are mounted between the slot 66 through which the support structure 42 extends and the slot 70 through which the actuator member 58 extends. Although it is believed that this specific arrangement of the slots 66, 68 and 70 and the Hall effect devices 24–30 may be preferred, it is contemplated that other arrangements of the slots and Hall effect devices may be utilized if desired.

The circuit board or rear panel 48 is connected directly to the front panel 54 by suitable fasteners (not shown). Thus, the flat major front side surface 62 on the circuit board 48 is disposed in abutting engagement with a flat major rear side surface 74 of the front panel 54. A flat major front side surface 76 of the front panel 54 extends parallel to the rear side surface 74. A rectangular recess 80 is formed in the front panel 54 to receive portions of components of the support structure 42 and actuator assembly 52.

By mounting the circuit board or rear panel 48 directly on the front panel 54, a build up of tolerances between the front and rear panels is eliminated. However, if desired, spacers could be provided between the circuit board 48 and front panel 54. Although it is preferred to have the base 22 formed by the circuit board or rear panel 48 and front panel 54, it is contemplated that the base could have a different construction if desired.

Support Structure

The support structure 42 supports the magnet carrier 44 on the circuit board 48 for movement along a linear path. The linear path along which the carrier 44 moves extends parallel to the rear major side surface 64 of the circuit board 48 on which the Hall effect devices 24–30 are mounted.

The support structure 42 includes a generally U-shaped support member 84 (FIGS. 1, 2 and 4) which is connected directly with the circuit board 48. The support member 84 includes a pair of upstanding parallel leg portions 86 and 88 (FIG. 4). The leg portions 86 and 88 are interconnected by a connector portion 90. The leg portions 86 and 88 and the connector portion 90 are integrally molded as one piece of a suitable polymeric material.

The leg portions 86 and 88 have retainer sections 94 and 96. The retainer sections 94 and 96 extend through the slots 66 and 68 (FIG. 3) in the circuit board 48 to connect the support structure 42 with the circuit board. The retainer section 94 (FIG. 4) includes a flange or nose portion 100 with a locating surface 102. The locating surface 102 engages the front major side surface 62 (FIG. 2) of the circuit board 48.

In addition, the leg portion 86 of the support member 84 has a locating shoulder or surface 106 (FIGS. 4 and 5). The location surface 106 engages the rear major side surface 64 of the circuit board 48. A second shoulder or locating surface 108 (FIG. 5) on the leg portion 86 of the support member 84 also engages the rear major side surface 64 of the circuit board 48.

The retainer section 96 (FIG. 4) on the leg portion 88 of the support member 84 has the same construction as the retainer section 94 on the leg portion 86 of the support member. Thus, the retainer section 96 on the leg portion 88 of the support member 84 includes a flange 112 having a locating or positioning surface 114. The locating surface 114 engages the front major side surface 62 of the circuit board 48. A shoulder or locating surface 116 on the leg portion 88 engages the rear major side surface 64 on the circuit board 48. A second shoulder or locating surface (not shown) also engages the rear major side surface 64 of the circuit board 48 in the same manner as in which the shoulder 108 engages the rear major side surface 64 of the circuit board 48.

The two retainer sections 94 and 96 of the generally U-shaped support member 84 extend through the slots 66 and 68 (FIG. 3) in the circuit board 48. Thus, the retainer section 94 (FIG. 4) of the support member 84 extends through the slot 66 in the circuit board 48 (FIG. 2) while the retainer section 96 extends through the slot 68 in the circuit board 48. The two retainer sections 94 and 96 firmly grip opposite sides of the circuit board 48 to accurately position the support member 84 relative to the circuit board and to retain the support member against movement relative to the circuit board.

A pair of linear tracks 122 and 124 are formed on the leg portions 86 and 88 of the support member 84 (FIGS. 2 and 4) to guide movement of the magnet carrier 44 relative to the circuit board 48. The tracks 122 and 124 have straight, parallel longitudinal axes which extend parallel to the rear major side surface 64 of the circuit board 48. The tracks 122 and 124 are engaged by the magnet carrier 44 to guide movement of the carrier along a linear path which extends parallel to the rear major side surface 64 of the circuit board 48. In the illustrated embodiment of the invention, the tracks 122 and 124 project inwardly from the leg portions 86 and 88 of the support member 84 (FIG. 4). However, the tracks 122 and 124 could be formed by linear slots in the leg portions 86 and 88 if desired. The linear slots would have longitudinal central axes extending parallel to the rear major side surface 64 of the circuit board 48.

Magnet Carrier

The magnets 34 and 36 (FIG. 2) are disposed on the magnet carrier 44. Thus, the magnet carrier 44 has a pair of rectangular recesses 130 and 132 (FIGS. 6, 7 and 8) in which the magnets 34 and 36 (FIG. 2) are disposed. The recesses 130 and 132 are formed in a generally rectangular main portion 134 (FIGS. 6, 7 and 8) of the magnet carrier 44.

A cylindrical central opening or socket 138 is formed in the magnet carrier 44 midway between the recesses 130 and 132 in which the magnets 34 and 36 are disposed. The central opening or socket 138 receives an inner or lower (as viewed in FIG. 2) end portion of the actuator member 58. Force is transmitted from the actuator member 58 to a cylindrical side surface of the socket 138 to move the magnet carrier 44 along the tracks 122 and 124.

A pair of slots 139 and 140 (FIGS. 6 and 8) are formed in the magnet carrier 44. The slots 139 and 140 engage the tracks 122 and 124 on the support member 84 (FIG. 4). The tracks 122 and 124 on the support member 84 and the slots 139 and 140 in the magnet carrier 44 cooperate to guide movement of the magnet carrier along a path extending parallel to the rear major side surface 64 of the circuit board 48.

In the illustrated embodiment of the invention, the magnet carrier 44 has a generally prism shaped lower (as viewed in FIGS. 1 and 7) locating portion 142 which cooperates with an index member 144 (FIGS. 1, 9, 10 and 11) to position the magnet carrier 44 relative to the support structure 42 and Hall effect devices 24–30. The locating portion 142 (FIG. 7) of the magnet carrier 44 has a generally triangular cross-sectional configuration with flat cam surfaces 148 and 150 which are skewed at an obtuse angle of approximately 110° relative to each other. Of course, the cam surfaces 148 and 150 could be skewed at a different angle relative to each other if desired.

Index Member

The index member 144 is pressed against the cam surfaces 148 and 150 on the magnet carrier 44 by a helical coil spring 152 (FIG. 2). The index member reciprocates vertically (as viewed in FIGS. 1 and 2) relative to the support structure 42. Thus, upon movement of the magnet carrier 44 from the position illustrated in FIGS. 1 and 2, the cam surfaces 148 and 150 (FIG. 1) on the magnet carrier 44 apply forces against the index member 144 urging the index member downward (as viewed in FIG. 1) against the influence of the biasing spring 152. As the magnet carrier 44 moves toward the position shown in FIG. 1, the biasing spring 152 presses the index member 144 against the magnet carrier 44 to urge the magnet carrier to the position shown in FIG. 1.

The index member 144 has a plurality of guide sections or arms 156, 158, 160 and 162 (FIG. 11) which extend outward from a generally rectangular body portion 164 of the index member. The arms 156–162 are received in parallel vertical slots 168 (FIG. 4) formed in the leg portions 86 and 88 of the support member 84. Although only a pair of vertical slots 168 for the leg portion 86 is illustrated in FIG. 5, it should be understood that another pair of vertical parallel slots 168 are formed in the leg portion 88.

The slots 168 in the leg portions 86 and 88 of the support member 84 guide movement of the index member 144 along a path which extends perpendicular to the tracks 122 and 124 (FIG. 3) on the support member 84 and perpendicular to the rear major side surface 64 of the circuit board 48. Although the illustrated embodiment of the index member 144 has a plurality of arms 156–162 which extend into guide slots 168 in the support member 84, it is contemplated that the support member 84 could be formed with a plurality of inwardly extending tracks, having a configuration corresponding to the tracks 122 and 124, which would engage slots in the index member 144 to guide movement of the index member relative to the support member.

In the illustrated embodiment of the invention, the switch assembly 20 is actuated between either one of two conditions. Thus, the switch assembly 20 is operable between a first condition illustrated in FIG. 1 in which the magnets 34 and 36 (FIG. 2) are adjacent to the Hall effect devices 26 and 28. The switch assembly 20 is also operable to a second condition in which the magnets 34 and 36 are adjacent to the Hall effect devices 24 and 30. The index member 144 is effective to hold the magnet carrier 44 in either the first condition in which the magnets 34 and 36 are adjacent to the Hall effect devices 26 and 28 or the second condition in which the magnets 34 and 36 are adjacent to the Hall effect devices 24 and 30.

When the index member 144 is in the first actuated condition, the cam surfaces 148 and 150 on the magnet carrier 44 (FIG. 7) engage a pair of cam surfaces 172 and 174 on the index member 144 (FIGS. 1 and 10). When the magnet carrier 44 is in the second condition, the cam surfaces 148 and 150 (FIG. 7) on the magnet carrier 44 engage a pair of cam surfaces 176 and 178 (FIG. 10) on the index member 144. However, if desired, the index member 144 could be constructed so as to retain the magnet carrier 44 in either a greater or lesser number of positions.

In the illustrated embodiment of the invention, the cam surfaces 172 and 176 (FIG. 10) are skewed at an angle of approximately 100° relative to each other. The cam surfaces 174 and 178 are skewed at an angle of approximately 110° relative to each other. Of course, the cam surfaces 172–178 could be skewed at the same angle relative to each other.

Actuator Assembly

The actuator assembly 52 is manually operable to effect movement of the magnet carrier 44 along the tracks 122 and 124 on the support member 84 (FIGS. 1 and 2). As this occurs, the index member 144 is first moved downward (as viewed in FIGS. 1 and 2) against the influence of the biasing spring 152. The index member 144 is then moved back upward by the spring 152, to accurately position the magnet carrier 44 relative to the Hall effect devices 24–30. The magnet carrier 44 is moved along the tracks 122 and 124 under the influence of manual force which is transmitted through the actuator member 58 to the magnet carrier 44.

The actuator member 58 includes a manually engageable upper (as viewed in FIG. 1) end portion or handle 184. The actuator member 58 has a generally spherical ball section 186 which is pivotal about an axis which extends parallel to the major side surfaces 74 and 76 of the front panel 54 and to the major side surfaces 62 and 64 of the circuit board 48. The axis about which the ball section 186 is pivotal is offset upwardly (as viewed in FIG. 1) from the front major side surface 76 of the front panel 54. The axis about which the ball section 186 is pivotal extends perpendicular to the tracks 122 and 124 (FIG. 2) along which the magnet carrier 44 (FIG. 1) is movable.

An actuator section 188 of the actuator member 58 extends downward (as viewed in FIG. 1) from the ball section 186. The actuator section 188 terminates at a generally spherical end portion 190. The generally spherical end portion 190 of the actuator member 58 is disposed in the cylindrical socket 138 in the magnet carrier 44. During pivotal movement of the actuator member 58 about the ball section 186, the end portion 190 of the actuator member slides along the cylindrical inner surface of the socket 138 while the magnet carrier 44 moves along the linear tracks 122 and 124.

The actuator member 58 is pivotally mounted on a support assembly 200. In accordance with one of the features of the present invention, the support assembly 200 is mounted on the front panel 54. Thus, the support structure 42 and magnet carrier 44 are mounted on the circuit board 48 while the actuator member 58 is mounted on the front panel 54 by the support assembly 200. This enables the actuator member support assembly 200 to be accurately positioned relative to the front panel 54 and the support structure 42 and magnet carrier 44 to be accurately positioned relative to the circuit board 48.

If there is some slight misalignment between the front panel 54 and circuit board 48, this misalignment will not effect the positioning of either the support assembly 200 relative to the front panel 54 or the positioning of the support structure 42 and magnet carrier 44 relative to the Hall effect devices 24–30. The ball and socket connection between the end portion 190 of the actuator member 58 and the magnet carrier 44 can accommodate a slight misalignment of the circuit board 48 and front panel 54.

The support assembly 200 includes a housing 204 (FIG. 1) having a cylindrical main section 206 which encloses the ball section 186 of the actuator member 58. An annular flange section 208 extends radially outward from the cylindrical main section 206 of the housing 204. The flange section 208 of the housing 204 is disposed in the recess 80. The flange section 208 has an axial extent which is slightly less than the depth of the recess 80 so that the flange section 208 does not engage the front major side surface 62 on the circuit board 48. The exterior of the main portion 206 of the housing 204 has external threads (not shown) and receives a nut (not shown) which is tightened to hold the housing 204 in place on the front panel 54.

A retainer bushing 216 is disposed in the housing 204 and cooperates with the housing to support the ball section 86 for pivotal movement relative to the housing. The retainer bushing 216 has a mounting section 218 with a configuration corresponding to the configuration of a portion of a cone. The retainer bushing 216 is snapped into the housing 204 and cooperates with the housing to grip the ball section 186 of the actuator member 58. The actuator section 188 of the actuator member 58 extends through the slot 70 (FIG. 11) in the circuit board 48.

Operation

When the switch assembly 20 is in the condition illustrated in FIG. 1, the magnets 34 and 36 (FIG. 2) are adjacent to the Hall effect devices 26 and 28. This results in the Hall effect devices 26 and 28 being activated to provide an output signal. At this time, the magnets 34 and 36 are spaced from the Hall effect devices 24 and 30. Therefore, the Hall effect devices 24 and 30 are ineffective to provide output signals.

The magnet carrier 44 is held in the position shown in FIG. 1 by the index member 144. Thus, the cam surfaces 172 and 174 on the index member 144 are pressed against the cam surfaces 148 and 150 on the magnet carrier 44 to position the carrier member 44 along the linear tracks 122 and 124. At this time, the central axis of the magnet 34 is coincident with the central axis of the Hall effect device 26 while the central axis of the magnet 36 is coincident with a central axis of the Hall effect device 28 (FIG. 2).

When the switch assembly is to be operated from the first condition shown in FIG. 1 to a second condition, the handle section 184 of the actuator member 58 is manually gripped. The handle section 184 is then pivoted in a clockwise direction about the ball section 186 of the actuator member 58. As this clockwise pivoting movement occurs, force is transmitted from the end portion 190 of the actuator member 58 to the magnet carrier 44. This force moves the magnet carrier 44 toward the left (as viewed in FIG. 1) along the linear tracks 122 and 124.

As the magnet carrier 44 moves along the tracks 122 and 124, the cam surface 148 on the magnet carrier 44 forces the index member 144 downward (as viewed in FIG. 1) against the influence of the biasing spring 152. After the magnet carrier 44 has moved through slightly more than one-half of the distance between the central axes of the Hall effect devices 24 and 26, the biasing spring 152 is effective to move the index member 144 upward (as viewed in FIG. 1). As this occurs, the cam surface 176 on the index member 144 is pressed against the cam surface 150 on the magnet carrier 44 and assists the actuator member 58 in moving the magnet carrier toward the left (as viewed in FIG. 1).

When the central axes of the magnets 34 and 36 have moved into alignment with the central axes of the Hall effect devices 24 and 30, the cam surface 178 on the index member 144 will have moved into engagement with the cam surface 148 on the magnet carrier 44. The index member 144 will then retain the magnet carrier 44 against further movement along the tracks 122 and 124.

As the magnets 34 and 36 are moved into alignment with the Hall effect devices 24 and 30, there will be a clearly defined point at which the magnets will effect activation of the Hall effect devices. This results in the Hall effect devices 24 and 30 providing a sharply defined output signal which clearly indicates which the switch assembly 20 is operated to the second condition. The precise activation of the Hall effect devices 24 and 30 is due to the fact that the magnet carrier 44 moves along a linear path which extends perpendicular to the central axes of the Hall effect devices 24 and 30.

When the switch assembly 20 is to be operated from the second condition back to the first condition (FIG. 1), the actuator member 58 is manually gripped and pivoted in a counterclockwise direction about the ball section 186. As this occurs, the index member 144 is first moved downward against the influence of the biasing spring 152 and is then moved upward under the influence of the biasing spring. When the magnet carrier reaches the position shown in FIG. 1, the magnets 34 and 36 will again be aligned with the Hall effect devices 26 and 28. This results in the Hall effect devices 26 and 28 again being activated and the Hall effect devices 24 and 30 again being deactivated. During pivotal movement of the actuator member 58, the end portion 190 of the actuator member will move along the cylindrical side surface of the socket 138 to accommodate movement of the magnet carrier 44 along the linear tracks 122 and 124 while the actuator member 58 is pivoted about the ball section 186.

The specific switch assembly 20 illustrated in FIG. 2 is a two position switch. Therefore, the index member 144 is constructed in such a manner as to hold the magnet carrier 44 in either one of two positions. However, it is contemplated that the switch assembly 20 could be a three or more position switch assembly or could be of the momentary actuation type. If the switch assembly 20 was of the three position type, the index member 144 would be constructed in such a manner as to have three discrete notches for holding the magnet carrier 44 in any one of three predetermined positions relative to the tracks 122 and 124. If the switch assembly 20 was of the momentary actuation type, the index member 144 could be constructed in such a manner as to bias the magnet carrier 44 toward a central position in which the magnets 34 and 36 are disposed midway between the Hall effect devices 26 and 28 and the Hall effect devices 24 and 30.

Conclusion

In view of the foregoing description, it is apparent that the present invention provides a new and improved switch assembly 20 which is operable between a plurality of conditions. The switch assembly 20 includes a base 22 and a carrier 44 which is movable relative to the base. An actuator member 58 extends through the base 22 and engages the carrier 44. One or more sensor components 24–30 mounted on the base 22 are actuated by one or more sensor components 34 and 36 mounted on the carrier 44 during movement of the carrier relative to the base.

The sensor components 24–30 which are mounted on the base 22 may be Hall effect devices. If the sensor components mounted on the base are Hall effect devices 24–30, the sensor component mounted on the carrier would be a magnet.

A support structure 42 supports the carrier 44 for movement along a linear path which extends parallel to an inner major side surface 64 of the base 22 on which the Hall effect devices 24–30 are mounted. Since the magnets 34 and 36 move along a linear path, there is precise activation of the Hall effect devices 24–30 by the magnets during movement of the carrier 44.

The base 22 includes a front panel 54 and a rear panel or circuit board 48 on which the Hall effect devices 24–30 are mounted. An actuator member 58 which moves the carrier 44 is pivotally mounted on the front panel 54 and extends through an opening in the front panel and the circuit board on which the Hall effect devices are mounted. The support structure 42 for the carrier 44 is mounted on the circuit board 48 on which the Hall effect devices 24–30 are mounted. By mounting the support structure 42 for the carrier 44 on the circuit board 48 on which the Hall effect devices 24–30 are mounted, accurate positioning of the carrier and magnets relative to the Hall effect devices is facilitated. An index member 144 may be provided to yieldably hold the carrier 44 in a desired position relative to the Hall effect devices 24–30.

Having described the invention, the following is claimed:

1. A switch assembly operable between a plurality of conditions, said switch assembly comprising a panel having first and second parallel major side surface, a support structure connected with said panel, said support structure including a first portion having a first locating surface which is engageable with the first major side surface of said panel and a second locating surface which is engageable with the second major side surface of said panel, said support structure including a second portion having a third locating surface which is engageable with the first major side surface of said panel and a fourth locating surface which is engageable with the second major side surface of said panel, a carrier disposed between said first and second portions of said support structure and movable relative to said first and second portions of said support structure and said panel, an actuator member connected with said carrier and said panel, said actuator member being pivotal about an axis extending parallel to said first and second major side surfaces of said panel to move said carrier relative to said first and second sections of said support structure and said panel, first and second Hall effect devices mounted at spaced apart locations on said first major side surface of said panel, and a magnet mounted on said carrier and movable relative to said first and second Hall effect devices with said carrier, said first Hall effect device and said magnet cooperating to provide a first output signal when said carrier is in a first position relative to said panel and support structure, said second Hall effect device and said magnet cooperating to provide a second output signal when said carrier is in a second position relative to said panel and support structure.

2. A switch assembly as set forth in claim 1 wherein said first portion of said support structure includes a first elongated guide surface having a longitudinal central axis which is disposed in a plane extending parallel to said first major side surface of said panel, said second portion of said support structure includes a second elongated guide surface having a longitudinal central axis which is disposed in a plane extending parallel to said first major side surface of said panel, said carrier having a first guide surface which is disposed in engagement with said first guide surface on said first portion of said support structure and a second guide surface which is disposed in engagement with said second guide surface on said second portion of said support structure to guide movement of said carrier relative to said support structure and said panel.

3. A switch assembly as set forth in claim 1 further including an index member disposed between said first and second portions of said support structure, a biasing spring disposed in engagement with said index member to urge said index member toward said carrier to yieldably retain said carrier against movement relative to said panel, said carrier being movable under the influence of force transmitted from said actuator member to said carrier to move said carrier relative to said panel against the influence of force applied against said carrier by said index member.

4. A switch assembly operable between a plurality of conditions, said switch assembly comprising a first panel, a second panel connected with said first panel, a first Hall effect device mounted on said first panel, a second Hall effect device mounted on said first panel at a location spaced from said first Hall effect device, a support structure fixedly connected with said first panel, a carrier disposed within and movable relative to said support structure, a magnet disposed on said carrier, said carrier being movable relative to said support structure and said first and second panels along a path which extends parallel to said first panel, said carrier being movable between a first position in which said magnet is disposed adjacent to said first Hall effect device and a second position in which said magnet is disposed adjacent to said second Hall effect device, an actuator member extending through openings in said first and second panels into engagement with said carrier, and actuator support means fixedly connected with said second panel for supporting said actuator member for movement relative to said second panel, said actuator member having a manually engageable handle portion which extends from said actuator support means in a direction away from said first panel and is manually movable relative to said second panel to effect movement of said carrier between the first and second positions.

5. A switch assembly as set forth in claim 4 further including a first guide track fixedly connected with said support structure and disposed in engagement with a portion of said carrier disposed adjacent to a first side of said carrier, a second guide track extending parallel to said first guide track and fixedly connected with said support structure, said second guide track being disposed in engagement with a portion of said carrier disposed adjacent to a second side of said carrier opposite from said first side of said carrier.

6. A switch assembly as set forth in claim 4 wherein said support structure includes a generally U-shaped support member having first and second leg portions interconnected by a connector portion, said first leg portion extends through an opening in said first panel and is engageable with opposite sides of said first panel to position said first leg portion relative to said first panel, said second leg portion of said support structure extends through an opening in said first panel and is engageable with opposite sides of said first panel to position said second leg portion relative to said first panel, said first and second Hall effect devices being disposed on said first panel at locations between said first and second leg portions of said support structure, said carrier being disposed between and being movable relative to said first and second leg portions of said support structure.

7. A switch assembly operable between a plurality of conditions, said switch assembly comprising a base, a carrier movable relative to said base along a linear path between a first position and a second position, an actuator member connected with said carrier and said base, said actuator member being pivotal relative to said base to move said carrier along the linear path between the first and second positions, first and second sensor components connected with said base at spaced apart locations along the linear path, a third sensor component connected with said carrier and movable along the linear path with said carrier, said third sensor component being disposed adjacent to and spaced from said first sensor component and cooperating with said first sensor component to provide a first output signal when said carrier is in the first position, said third sensor component being disposed adjacent to and spaced from said second sensor component and cooperating with said second sensor component to provide a second output signal when said carrier is in the second position, and a generally U-shaped support member having first and second leg portions interconnected by a connector portion, said first leg portion having a retainer section connected with said base adjacent to a first side of the linear path, said second leg portion having a retainer section connected with said base adjacent to a second side of the linear path, said carrier being disposed between said first and second leg portions and movable relative to said first and second leg portions along the linear path.

8. A switch assembly as set forth in claim 7 wherein said first and second sensor components are Hall effect devices and said third sensor component is a magnet.

9. A switch assembly as set forth in claim 7 wherein said base includes a panel having a major side surface extending parallel to the linear path, said first and second sensor components being mounted on said major side surface of said panel, said actuator member being pivotal about an axis which extends parallel to said major side surface of said panel and perpendicular to a longitudinal central axis of the linear path.

10. A switch assembly as set forth in claim 7 wherein said actuator member has an end portion which is received in said carrier, said end portion of said actuator member being movable relative to said carrier along a path extending transversely to the linear path during movement of the carrier between the first and second positions.

11. A switch assembly as set forth in claim 7 wherein said base includes a first panel having first and second parallel major side surfaces, said first and second sensor components being mounted on said first side surface of said first panel, said base includes a second panel having first and second parallel major surfaces, said first major side surface of said second panel being disposed in abutting engagement with said second major side surface of said first panel, said first and second panels cooperating to at least partially define a recess disposed between said first and second panels, said retainer section on said first leg portion and said retainer section on said second leg portion being disposed in engagement with said second major side surface of said first panel.

12. A switch assembly as set forth in claim 11 further including an actuator housing extending through an opening in said second panel, said actuator housing having a mounting section disposed in the recess between said first and second panels and a side wall which is connected with said mounting section of said actuator housing and extends through the opening in said second panel, said actuator member having a manually engageable handle portion which extends outward from said actuator housing, a support portion which is connected with said handle portion and is disposed within said actuator housing, and an operator portion which engages said carrier, said support portion of said actuator member being supported for pivotal movement about an axis which extends parallel to said second major side surfaces of said first and second panels and is offset from said second panel in a direction away from said first panel, said operator portion of said actuator member extends from said support portion of said actuator member through the opening in said second panel and the recess between the first and second panels into engagement with said carrier.

13. A switch assembly as set forth in claim 7 wherein said base includes a panel having first and second major side surfaces extending parallel to the linear path, said first and second sensor components being mounted on said first major side surface of said panel, said retainer section of said first leg portion being disposed in engagement with said second major side surface of said panel, said retainer section of said second leg portion being disposed in engagement with said second major side surface of said panel, said actuator member being pivotal about an axis which extends parallel to said second major side surface of said panel and is offset from said panel in a direction away from said carrier, said actuator member extends through an opening in said panel into engagement with said carrier at a location between said first and second leg portions of said support member.

14. A switch assembly as set forth in claim 7 further including a first guide surface connected with said first leg portion of said support member at a location spaced from said connector portion of said support member and a second guide surface connected with said second leg portion of said support member at a location spaced from said connector portion of said support member, said carrier being disposed in engagement with said first and second guide surfaces to enable said first and second guide surfaces to guide movement of said carrier along the linear path.

15. A switch assembly as set forth in claim 7 further including an index member disposed between said first and second leg portions of said support member, a biasing spring disposed between said first and second leg portions of said support member to urge said index member toward said carrier to yieldably retain said carrier against movement relative to said base, said carrier being movable under the influence of force transmitted from said actuator member to said carrier to move said carrier relative to said base against the influence of force applied against said carrier by said index member.

16. A switch assembly as set forth in claim 15 wherein said index member is movable relative to said support member under the influence of force transmitted from said carrier to said index member upon movement of said carrier relative to said base, said switch assembly further including a first guide surface connected with said first leg portion of support member and a second guide surface connected with said second leg portion of said support member, said index member being disposed in engagement with said first and second guide surfaces to enable said first and second guide surfaces to guide movement of said index member relative to said support member.

17. A switch assembly as set forth in claim 7 wherein said carrier has a plurality of cam surfaces which extend transverse to the linear path, said switch assembly further including an index member disposed between said first and second leg portions of said support member, said index member being movable relative to said first and second leg portions of said support member under the influence of force transmitted from said cam surfaces to said index member upon movement of said carrier along the linear path.

18. A switch assembly as set forth in claim 7 wherein said index member is disposed between said carrier and said connector portion of said support member, said switch assembly further including a biasing spring which urges said index member away from said connector portion of said support member toward said carrier, said index member being movable toward said connector portion of said support member against the influence of said biasing spring under the influence of force transmitted from said cam surfaces to said index member.

19. A switch assembly as set forth in claim 7 further including an index member disposed between said first and second leg portions of said support member and engageable with said carrier to yieldably retain said carrier against movement along the linear path, said index member being movable toward said connector portion of said support member under the influence of force applied against said index member by said carrier upon movement of said carrier along the linear path.

20. A switch assembly as set forth in claim 19 further including a biasing spring disposed between said connector portion of said support member and said index member for urging said index member toward said carrier, said carrier having first and second cam surfaces which extend transversely to the linear path and which extend at an acute angle relative to each other, said index member having third and fourth cam surfaces which extend transversely to the linear path and which extend at an acute angle relative to each other, said first cam surface on said carrier being pressed against said third cam surface on said index member under the influence of force transmitted from said actuator member to said carrier upon pivotal movement of said actuator member in one direction to move said index member toward said connector portion of said support member against the influence of said biasing spring, said second cam surface on said carrier being pressed against said fourth cam surface on said index member under the influence of force transmitted from said actuator member to said carrier upon pivotal movement of said actuator member in a direction opposite to the one direction to move said index member toward said connector portion of said support member against the influence of said biasing spring.

21. A switch assembly operable between a plurality of conditions, said switch assembly comprising a base, a carrier movable relative to said base along a linear path between a first position and a second position, an actuator member connected with said carrier and said base, said actuator member being pivotal relative to said base to move said carrier along the linear path between the first and second positions, first and second sensor components connected with said base at spaced apart locations along the linear path, said first and second sensor components are Hall effect devices, and a third sensor component connected with said carrier and movable along the linear path with said carrier, said third sensor component is a magnet, said third sensor component being disposed adjacent to and spaced from said first sensor component and cooperating with said first sensor component to provide a first output signal when said carrier is in the first position, said third sensor component being disposed adjacent to and spaced from said second sensor component and cooperating with said second sensor component to provide a second output signal when said carrier is in the second position.

22. A switch assembly as set forth in claim 21 further including a support structure having first and second leg portions, said first leg portion being connected with said base adjacent to a first side of the linear path, said second leg portion being connected with said base adjacent to a second side of the linear path, said carrier being disposed between said first and second leg portions and movable relative to said first and second leg portions along the linear path.

23. A switch assembly as set forth in claim 22 further including an index member disposed between said first and second leg portions of said support structure and engageable with said carrier to yieldably retain said carrier against movement along the linear path, said index member being movable relative to said support structure under the influence of force applied against said index member by said carrier upon movement of said carrier along the linear path.

24. A switch assembly as set forth in claim 23 further including a biasing spring disposed in engagement with said index member for urging said index member toward said carrier, said carrier having first and second cam surfaces which extend transversely to the linear path, said index member having third and fourth cam surfaces which extend transversely to the linear path, said first cam surface on said carrier being pressed against said third cam surface on said index member under the influence of force transmitted from said actuator member to said carrier upon pivotal movement of said actuator member in one direction to move said index member against the influence of said biasing spring, said second cam surface on said carrier being pressed against said fourth cam surface on said index member under the influence of force transmitted from said actuator member to said carrier upon pivotal movement of said actuator member in a direction opposite to the one direction to move said index member against the influence of said biasing spring.

25. A switch assembly as set forth in claim 21 wherein said actuator member has an end portion which is received in said carrier, said end portion of said actuator member being movable relative to said carrier along a path extending transversely to the linear path during movement of the carrier between the first and second positions.

26. A switch assembly as set forth in claim 21 wherein said base includes a first panel having first and second parallel major side surfaces, said first and second sensor components being mounted on said first side surface of said first panel, said base including a second panel having first and second parallel major surfaces, said first major side surface of said second panel being disposed in abutting engagement with said second major side surface of said first panel, said first and second panels cooperating to at least partially define a recess disposed between said first and second panels, said switch assembly including a support member having a first mounting section which extends through a first opening in said first panel into the recess between said first and second panels, said first mounting section having a first locating surface which engages said first major side surface of said first panel and a second locating surface which engages said second major side surface of said first panel to position said first mounting section relative to said first panel, said support member having a second mounting section which extends through a second opening in said first panel into the recess between said first and second panels, said second mounting section having a first locating surface which engages said first major side surface of said first panel and a second locating surface which engages said second major side surface of said first panel to position said second mounting section relative to said first panel, and first and second guide surfaces connected with said first and second mounting sections of said support member, said carrier being disposed in engagement with said first and second guide surfaces to enable said first and second guide surfaces to guide movement of said carrier along said linear path.

27. A switch assembly operable between a plurality of conditions, said switch assembly comprising a base, a carrier movable relative to said base along a linear path between a first position and a second position, an actuator member connected with said carrier and said base, said actuator member being pivotal relative to said base to move said carrier along the linear path between the first and second positions, first and second sensor components connected with said base at spaced apart locations along the linear path, and a third sensor component connected with said carrier and movable along the linear path with said carrier, said third sensor component being disposed adjacent to and spaced from said first sensor component and cooperating with said first sensor component to provide a first output signal when said carrier is in the first position, said third sensor component being disposed adjacent to and spaced from said second sensor component and cooperating with said second sensor component to provide a second output signal when said carrier is in the second position, said base includes a panel having a major side surface extending parallel to the linear path, said first and second sensor components being mounted on said major side surface of said panel, said actuator member being pivotal about an axis which extends parallel to said major side surface of said panel and perpendicular to a longitudinal central axis of the linear path.

28. A switch assembly as set forth in claim 27 wherein said actuator member has an end portion which is received in said carrier, said end portion of said actuator member being movable relative to said carrier along an arcuate path extending transversely to the linear path and to the major side surface of said panel during movement of the carrier between the first and second positions.

29. A switch assembly as set forth in claim 27 wherein said base includes a second panel, said panels cooperating to at least partially define a recess disposed between said panels, said switch assembly including a support member having a mounting section which extends into the recess between said panels.

30. A switch assembly as set forth in claim 27 wherein said switch assembly further including a carrier support having surface means for guiding movement of said carrier along the linear path, said carrier support having first and second mounting sections connected with said panel, said carrier being disposed between said first and second mounting sections, said actuator member being pivotal about an axis which extends parallel to said second major side surface of said panel and is offset from said panel in a direction away from said carrier, said actuator member extends through an opening in said panel into engagement with said carrier at a location between said first and second mounting sections of said carrier support.

31. A switch assembly as set forth in claim 27 further including a support structure having first and second leg portions connected with said panel, said carrier being disposed between said first and second leg portions and movable relative to said first and second leg portions and said panel along the linear path.

32. A switch assembly as set forth in claim 31 further including an index member disposed between said first and second leg portions of said support structure and engageable with said carrier to yieldably retain said carrier against movement along the linear path, said index member being movable relative to said first and second leg portions and said panel under the influence of force applied against said index member by said carrier upon movement of said carrier along the linear path.

33. A switch assembly as set forth in claim, further including a biasing spring for urging said index member toward said carrier, said carrier having first and second cam surfaces which extend transversely to the linear path, said index member having third and fourth cam surfaces which extend transversely to the linear path, said first cam surface on said carrier being pressed against said third cam surface on said index member under the influence of force transmitted from said actuator member to said carrier upon pivotal movement of said actuator member in one direction to move said index member against the influence of said biasing spring, said second cam surface on said carrier being pressed against said fourth cam surface on said index member under the influence of force transmitted from said actuator member to said carrier upon pivotal movement of said actuator member in a direction opposite to the one direction to move said index member against the influence of said biasing spring.

34. A switch assembly as set forth in claim 27 wherein said first and second sensor components are Hall effect devices which are mounted on said major side surface of said panel and said third sensor component is a magnet which is mounted on said carrier for movement therewith relative to said panel.

35. A switch assembly operable between a plurality of conditions, said switch assembly comprising a base, a carrier movable relative to said base along a linear path between a first position and a second position, an actuator member connected with said carrier and said base, said actuator member being pivotal relative to said base to move said carrier along the linear path between the first and second positions, first and second sensor components connected with said base at spaced apart locations along the linear path, and a third sensor component connected with said carrier and movable along the linear path with said carrier, said third sensor component being disposed adjacent to and spaced from said first sensor component and cooperating with said first sensor component to provide a first output signal when said carrier is in the first position, said third sensor component being disposed adjacent to and spaced from said second sensor component and cooperating with said second sensor component to provide a second output signal when said carrier is in the second position, said base includes a first panel having first and second parallel major side surfaces, said first and second sensor components being mounted on said first side surface of said first panel, said base including a second panel having first and second parallel major surfaces, said first major side surface of said second panel being disposed in abutting engagement with said second major side surface of said first panel, said first and second panels cooperating to at least partially define a recess disposed between said first and second panels, said switch assembly including a support member having a first mounting section which extends through a first opening in said first panel into the recess between said first and second panels, said first mounting section having a first locating surface which engages said first major side surface of said first panel and a second locating surface which engages said second major side surface of said first panel to position said first mounting section relative to said first panel, said support member having a second mounting section which extends through a second opening in said first panel into the recess between said first and second panels, said second mounting section having a first locating surface which engages said first major side surface of said first panel and a second locating surface which engages said second major side surface of said first panel to position said second mounting section relative to said first panel, and first and second guide surfaces connected with said first and second mounting sections of said support member, said carrier being disposed in engagement with said first and second guide surfaces to enable said first and second guide surfaces to guide movement of said carrier along said linear path.

36. A switch assembly as set forth in claim 35 further including an actuator housing extending through an opening in said second panel, said actuator housing having a mounting section disposed in the recess between said first and second panels and a side wall which is connected with said mounting section of said actuator housing and extends through the opening in said second panel, said actuator member having a manually engageable handle portion which extends outward from said actuator housing, a support portion which is connected with said handle portion and is disposed within said actuator housing, and an operator portion which engages said carrier, said support portion of said actuator member being supported for pivotal movement about an axis which extends parallel to said second major side surfaces of said first and second panels and is offset from said second panel in a direction away from said first panel, said operator portion of said actuator member extends from said support portion of said actuator member through the opening in said second panel and the recess between the first and second panels into engagement with said carrier.

37. A switch assembly operable between a plurality of conditions, said switch assembly comprising a base, a carrier movable relative to said base along a linear path between a first position and a second position, said base includes a panel having a major side surface extending parallel to the linear path, an actuator member connected with said carrier and said base, said actuator member being pivotal relative to said base to move said carrier along the linear path between the first and second positions, first and second sensor components connected with said base at spaced apart locations along the linear path, said first and second sensor components being mounted on said major side surface of said panel, a third sensor component connected with said carrier and movable along the linear path with said carrier, said third sensor component being disposed adjacent to and spaced from said first sensor component and cooperating with said first sensor component to provide a first output signal when said carrier is in the first position, said third sensor component being disposed adjacent to and spaced from said second sensor component and cooperating with said second sensor component to provide a second output signal when said carrier is in the second position, and a carrier support having surface means for guiding movement of said carrier along the linear path, said carrier support having first and second mounting sections connected with said panel, said carrier being disposed between said first and second mounting sections, said actuator member being pivotal about an axis which extends parallel to said second major side surface of said panel and is offset from said panel in a direction away from said carrier, said actuator member extends through an opening in said panel into engagement with said carrier at a location between said first and second mounting sections of said carrier support.

38. A switch assembly as set forth in claim 37 wherein said first mounting section has a retainer connected with said panel adjacent to a first side of the linear path, said second mounting section having a retainer connected with said panel adjacent to a second side of the linear path.

39. A switch assembly as set forth in claim 37 further including an index member disposed between said first and second mounting sections of said carrier support and engageable with said carrier to yieldably retain said carrier against movement along the linear path, said index member being movable away from said panel under the influence of force applied against said index member by said carrier upon movement of said carrier along the linear path.

40. A switch assembly as set forth in claim 37 further including an index member disposed between said first and second mounting sections of said carrier support and engageable with said carrier, a biasing spring disposed between said first and second mounting sections to urge said index member toward said carrier, said carrier having first and second cam surfaces which extend transversely to the linear path, said index member having third and fourth cam surfaces which extend transversely to the linear path, said first cam surface on said carrier being pressed against said third cam surface on said index member under the influence of force transmitted from said actuator member to said carrier upon pivotal movement of said actuator member in one direction to move said index member against the influence of said biasing spring, said second cam surface on said carrier being pressed against said fourth cam surface on said index member under the influence of force transmitted from said actuator member to said carrier upon pivotal movement of said actuator member in a direction opposite to the one direction to move said index member against the influence of said biasing spring.

41. A switch assembly as set forth in claim 37 wherein said first and second sensor components are Hall effect devices and said third sensor component is a magnet.

42. A switch assembly as set forth in claim 37 wherein said actuator member has an end portion which is received in said carrier, said end portion of said actuator member being movable relative to said carrier along a path extending transversely to the linear path during movement of the carrier between the first and second positions.

43. A switch assembly as set forth in claim 37 wherein said first mounting section extends through a first opening in said panel, said first mounting section having locating surfaces which engage opposite major side surfaces of said panel to position said first mounting section relative to said panel, said second mounting section extends through a second opening in said panel, said second mounting section having locating surfaces which engage opposite major side surfaces of said panel to position said second mounting section relative to said panel, said switch assembly further including first and second guide surfaces connected with said first and second mounting sections of said carrier support, said carrier being disposed in engagement with said first and second guide surfaces to enable said first and second guide surfaces to guide movement of said carrier along said linear path.

44. A switch assembly as set forth in claim 37 further including a first guide surface connected with said first mounting section of said carrier support and extending parallel to said major side surface of said panel and a second guide surface connected with said second mounting section of said carrier support and extending parallel to said major side surface of said panel, said carrier being disposed in engagement with said first and second guide surfaces to enable said first and second guide surfaces to guide movement of said carrier along the linear path.

45. A switch assembly as set forth in claim 37 further including an index member disposed between said first and second mounting sections of said carrier support, a biasing spring disposed between said first and second mounting sections of said carrier support to urge said index member toward said carrier to yieldably retain said carrier against movement relative to said base, said carrier being movable under the influence of force transmitted from said actuator member to said carrier to move said carrier relative to said panel against the influence of force applied against said carrier by said index member.

46. A switch assembly as set forth in claim 37 wherein said index member is movable relative to said carrier support under the influence of force transmitted from said carrier to said index member upon movement of said carrier relative to said panel, said switch assembly further including a first guide surface connected with said first mounting section of said carrier support and a second guide surface connected with said second mounting section of said carrier support, said index member being disposed in engagement with said first and second guide surfaces to enable said first and second guide surfaces to guide movement of said index member relative to said carrier support.

47. A switch assembly as set forth in claim 46 wherein said first and second guide surfaces extend perpendicular to said major side surface of said panel.

48. A switch assembly as set forth in claim 37 wherein said carrier has a plurality of cam surfaces which extend transverse to the linear path, said switch assembly further including an index member disposed between said first and second mounting sections of said carrier support, said index member being movable relative to said first and second mounting sections of said carrier support under the influence of force transmitted from said cam surfaces to said index member upon movement of said carrier along the linear path.

49. A switch assembly as set forth in claim 48 wherein said index member is disposed on a side of said carrier opposite from said panel, said switch assembly further including a biasing spring which urges said index member toward said carrier, said index member being movable away form said panel against the influence of said biasing spring under the influence of force transmitted from said cam surfaces toward index member.

* * * * *

UNITED STATES PATENT AND TRADEMARK OFFICE
CERTIFICATE OF CORRECTION

PATENT NO. : 5,861,796
DATED : January 19, 1999
INVENTOR(S) : Richard G. Benshoff It is certified that error appears in the above-indentified patent and that said Letters Patent is hereby corrected as shown below:

Column 13, line 24, change "7" to --17--

Column 16, line 25, after "claim" insert --32--

Column 19, line 30, change "37" to --45--

Signed and Sealed this

Twenty-first Day of November, 2000

Attest:

Q. TODD DICKINSON

*Attesting Officer*  *Director of Patents and Trademarks*